(12) United States Patent
Huang et al.

(10) Patent No.: US 7,750,683 B2
(45) Date of Patent: Jul. 6, 2010

(54) PHASE/FREQUENCY DETECTOR

(75) Inventors: Hsien-Sheng Huang, Hsinchu (TW);
Feng-Chia Chang, Taipei County (TW)

(73) Assignee: Etron Technology, Inc., Hsinchu (TW)

( * ) Notice: Subject to any disclaimer, the term of this patent is extended or adjusted under 35 U.S.C. 154(b) by 129 days.

(21) Appl. No.: 12/252,329

(22) Filed: Oct. 15, 2008

(65) Prior Publication Data
US 2010/0019802 A1    Jan. 28, 2010

(30) Foreign Application Priority Data
Jul. 25, 2008    (TW) .............................. 97128416 A

(51) Int. Cl.
*H03D 13/00* (2006.01)
(52) U.S. Cl. .............................. 327/12; 327/7; 327/43; 327/42
(58) Field of Classification Search .................. 327/2, 327/3, 7, 16, 17, 40–43, 47
See application file for complete search history.

(56) References Cited
U.S. PATENT DOCUMENTS 4,904,948 A * 2/1990 Asami .......................... 327/12
6,741,102 B1 * 5/2004 Thomas ......................... 327/3
7,053,666 B2 * 5/2006 Tak et al. ....................... 327/3
7,456,661 B2 * 11/2008 Schmidt ........................ 327/3
7,598,775 B2 * 10/2009 Hu et al. ....................... 327/12

* cited by examiner

*Primary Examiner*—Hai L Nguyen
(74) *Attorney, Agent, or Firm*—Winston Hsu

(57) ABSTRACT

PFD includes UP and DOWN signal modules, and RESET signal module. UP and DOWN signal modules transmit UP and DOWN signals according to reference and fed-back clock signals. RESET module includes UP-RESET and DOWN-RESET signal modules. UP-RESET signal module resets UP signal module according to pre-trigger fed-back signal, UP and DOWN signals. Pre-trigger fed-back signal is generated according to original fed-back clock signal and calculation of logic gates and inverting delay module. DOWN-RESET signal module resets DOWN signal module according to pre-trigger reference signal, UP and DOWN signals. Pre-trigger reference signal is generated according to original reference clock signal and calculation of logic gates and inverting delay module.

13 Claims, 10 Drawing Sheets

PHASE/FREQUENCY DETECTOR

BACKGROUND OF THE INVENTION

1. Field of the Invention

The present invention relates to a Phase/Frequency Detector (PFD), and more particularly, to a PFD with precise phase determination.

2. Description of the Prior Art

Generally, the Phase Locked Loop (PLL) comprises a PFD, a voltage controller, and a Voltage Control Oscillator (VCO). The VCO generates a clock signal according to a voltage $V_X$, and feeds the clock signal back to the PFD. The PFD compares the phase of the fed-back clock signal with the phase of a reference clock signal. If the phase of the reference clock signal is ahead of the phase of the fed-back clock signal, the PFD outputs a rising signal (UP) $S_{UP}$ to the voltage controller for pulling up the voltage $V_X$ so as to increase the frequency of the fed-back clock signal. If the phase of the reference clock signal falls behind the phase of the fed-back clock signal, the PFD outputs a falling signal (DOWN) $S_{DN}$ to the voltage controller for pulling down the voltage $V_X$ so as to decrease the frequency of the fed-back clock signal.

Please refer to FIG. 1. FIG. 1 is a diagram illustrating a conventional PFD 100. As shown in FIG. 1, the PFD comprises two flip-flops 1 and 2, and a NAND gate 3. The flip-flops 1 and 2 receive the reference clock signal $CLK_{REF}$ and the fed-back clock signal $CLK_{FB}$, respectively, and output the rising signal $S_{UP}$ and the falling signal $S_{DN}$, respectively. The two input ends of the NAND gate 3 receive the rising signal $S_{UP}$ and the falling signal $S_{DN}$, respectively, and a reset signal $S_{RESET}$ is generated accordingly in order to reset the flip-flops 1 and 2.

Please refer to FIG. 2. FIG. 2 is a timing diagram illustrating the operation of the PFD 100. As shown in FIG. 2, when the first rising edge $E_{REF1}$ of the reference clock signal $CLK_{REF}$ inputs to the flip-flop 1, after a delay period $T_{D1}$, the rising signal $S_{UP}$ is pulled up to be logic "1"; when the first rising edge $E_{FB1}$ of the fed-back clock signal $CLK_{FB}$ inputs to the flip-flop 2, after the delay period $T_{D1}$, the falling signal $S_{DN}$ is pulled up to be logic "1". When both of the signals $S_{UP}$ and $S_{DN}$ are logic "1", after a delay period $T_{D2}$, the reset signal $S_{RESET}$ is triggered to reset the flip-flops 1 and 2. The shortest period of the reset signal $S_{RESET}$ is $T_{RESET}$ because of the delay. Consequently, when the phases of the reference clock signal $CLK_{REF}$ and the fed-back clock signal $CLK_{FB}$ are too close, the conventional PFD 100 tends to determine incorrectly. As shown in FIG. 2, the phase of the reference clock signal $CLK_{REF}$ is ahead of the phase of the fed-back clock signal $CLK_{FB}$. However, since the period of the reset signal $S_{RESET}$ is so long that the second rising edge $E_{REF2}$ of the reference clock signal $CLK_{REF}$ is ignored, causing that the PFD 100, in the next time, determines the phase of the fed-back clock signal $CLK_{FB}$ is ahead of the reference clock signal $CLK_{REF}$, which is incorrect. More particularly, in FIG. 2, the phase of the reference clock signal $CLK_{REF}$ is ahead of the fed-back clock signal $CLK_{FB}$, so that the frequency of the fed-back clock signal $CLK_{FB}$ should be increased. However, it is shown in FIG. 2 that the rising signal $S_{UP}$, triggered by the rising edge $E_{REF3}$, has shorter period than the falling signal $S_{DN}$, triggered by the rising edge $E_{FB2}$, which is, the voltage $V_X$ is pulled down. That means the frequency of the fed-back signal $CLK_{FB}$ is decreased instead. Thus, the conventional PFD 100, is limited by the period of the reset signal $S_{RESET}$, and tends to lock the phase of the fed-back signal in an incorrect direction.

Please refer to FIG. 3. FIG. 3 is a diagram illustrating the relationship between the phase difference and the output voltage of the PLL utilising the conventional PFD 100. It is assumed that the clock of the reference clock signal $CLK_{REF}$ is T. As shown in FIG. 3, when the phase of the reference clock signal $CLK_{REF}$ is ahead of the fed-back clock signal $CLK_{FB}$ by the range from 0 to $(T_{RESET}/T)$, the output voltage of the voltage controller of the PLL keeps rising and positive. That is, the frequency of the fed-back clock signal $CLK_{FB}$ would be increased. However, when the phase of the reference clock signal $CLK_{REF}$ is ahead of the fed-back clock signal $CLK_{FB}$ by the range from $(T_{RESET}/T)$ to $2\pi$, the output voltage of the voltage controller of the PLL, instead, becomes negative. That is, the frequency of the fed-back clock signal $CLK_{FB}$ would be decreased so that the phase of the fed-back clock signal $CLK_{FB}$ is locked to the incorrect direction. When the phase of the reference clock signal $CLK_{REF}$ falls behind the fed-back clock signal $CLK_{FB}$ by the range from 0 to $(-T_{RESET}/T)$, the output voltage of the voltage controller of the PLL keeps falling and negative. That is, the frequency of the fed-back clock signal $CLK_{FB}$ would be decreased. However, when the phase of the reference clock signal $CLK_{REF}$ falls behind the fed-back clock signal $CLK_{FB}$ by the range from $(-T_{RESET}/T)$ to $-2\pi$, the output voltage of the voltage controller of the PLL, instead, becomes positive. That is, the frequency of the fed-back clock signal $CLK_{FB}$ would be increased so that the phase of the fed-back clock signal $CLK_{FB}$ is locked to the incorrect direction.

SUMMARY OF THE INVENTION

The present invention provides a Phase/Frequency Detector (PFD). The PFD comprises a rising signal module for generating a rising signal according to a second reference clock signal and a rising reset signal; a falling signal module for generating a falling signal according to a second fed-back clock signal and a falling reset signal; and a reset signal module, comprising a rising reset signal module, comprising a first NAND gate, comprising a first input end for receiving a pre-trigger fed-back signal; a second input end for receiving the falling signal; and an output end for outputting result of NAND operation on signals received on the first and the second input ends of the first NAND gate; a first OR gate, comprising a first input end for receiving an inverted signal of the rising signal; a second input end for receiving an inverted signal of the falling signal; and an output end for outputting result of OR operation on signals received on the first and the second input ends of the first OR gate; a second NAND gate, comprising a first input end coupled to the output end of the first NAND gate; a second input end coupled to the output end of the first OR gate; and an output end for outputting result of NAND operation on signals received on the first and the second input ends of the second NAND gate as the rising reset signal; and a falling reset signal module, comprising a third NAND gate, comprising a first input end for receiving a pre-trigger reference signal; a second input end for receiving the rising signal; and an output end for outputting result of NAND operation on signals received on the first and the second input ends of the third NAND gate; a second OR gate, comprising a first input end for receiving an inverted signal of the rising signal; a second input end for receiving an inverted signal of the falling signal; and an output end for outputting result of OR operation on signals received on the first and the second input ends of the second OR gate; a fourth NAND gate, comprising a first input end coupled to the output end of the third NAND gate; a second input end coupled to the output end of the second OR gate; and an output end for outputting result of NAND operation on signals received on the first and the second input ends of the fourth NAND gate as the falling reset signal; and These and other objectives of the present invention will no doubt become obvious to those of ordinary skill in the art after reading the following detailed description of the preferred embodiment that is illustrated in the various figures and drawings.

DETAILED DESCRIPTION

Figure 1:
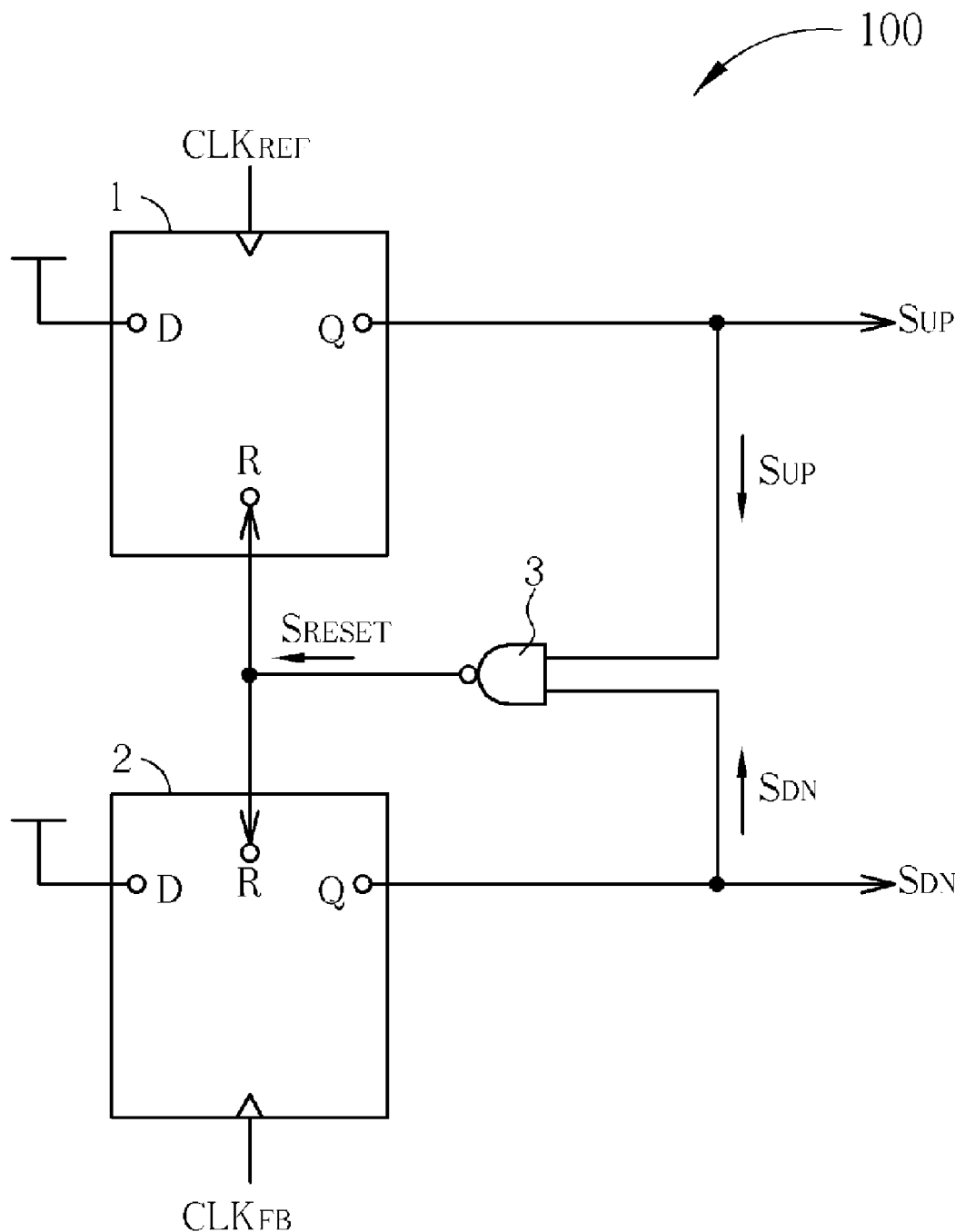
FIG. 1 is a diagram illustrating a conventional PFD.
Figure 2:
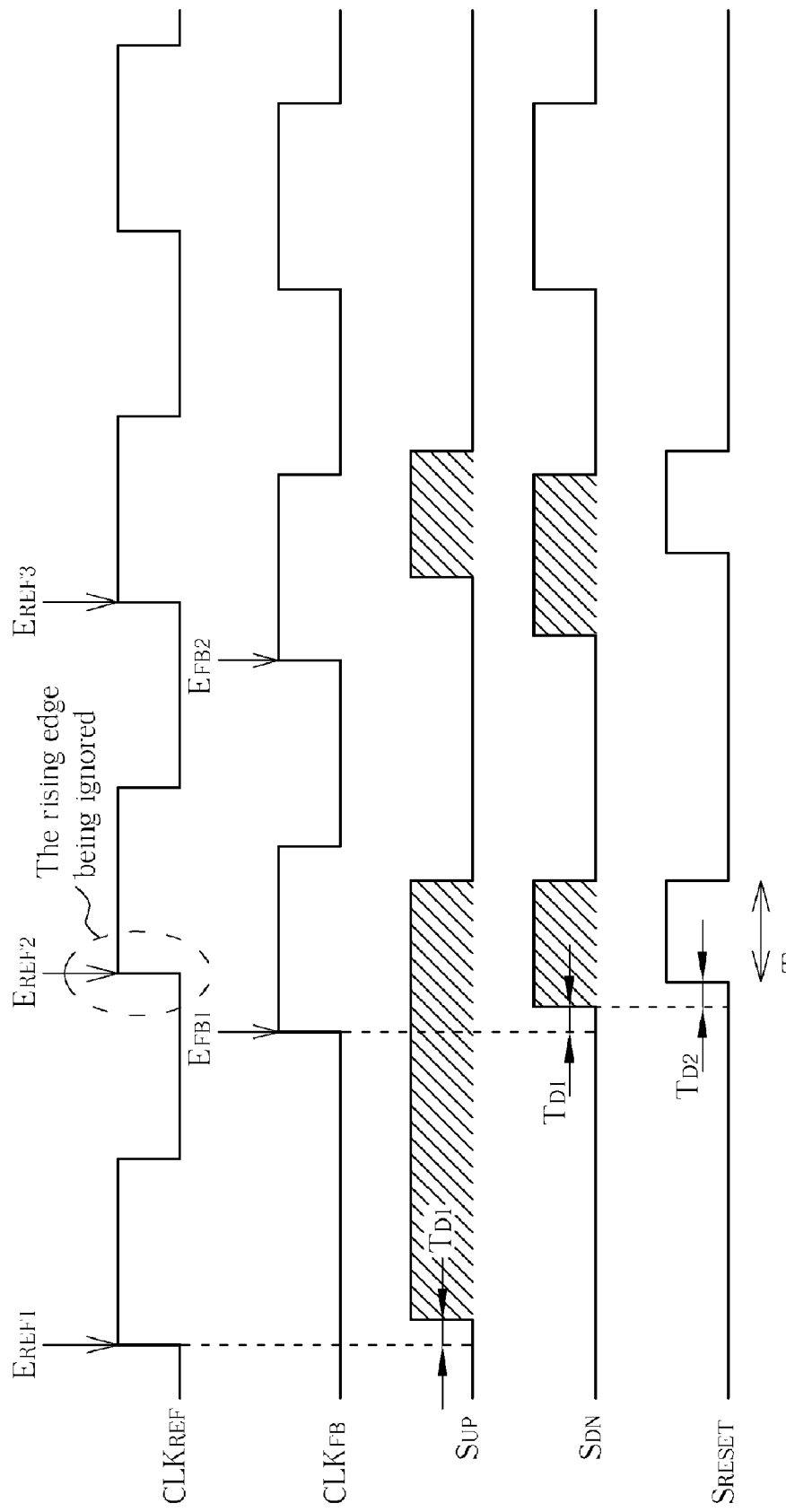
FIG. 2 is a timing diagram illustrating the operation of the PFD.
Figure 3:
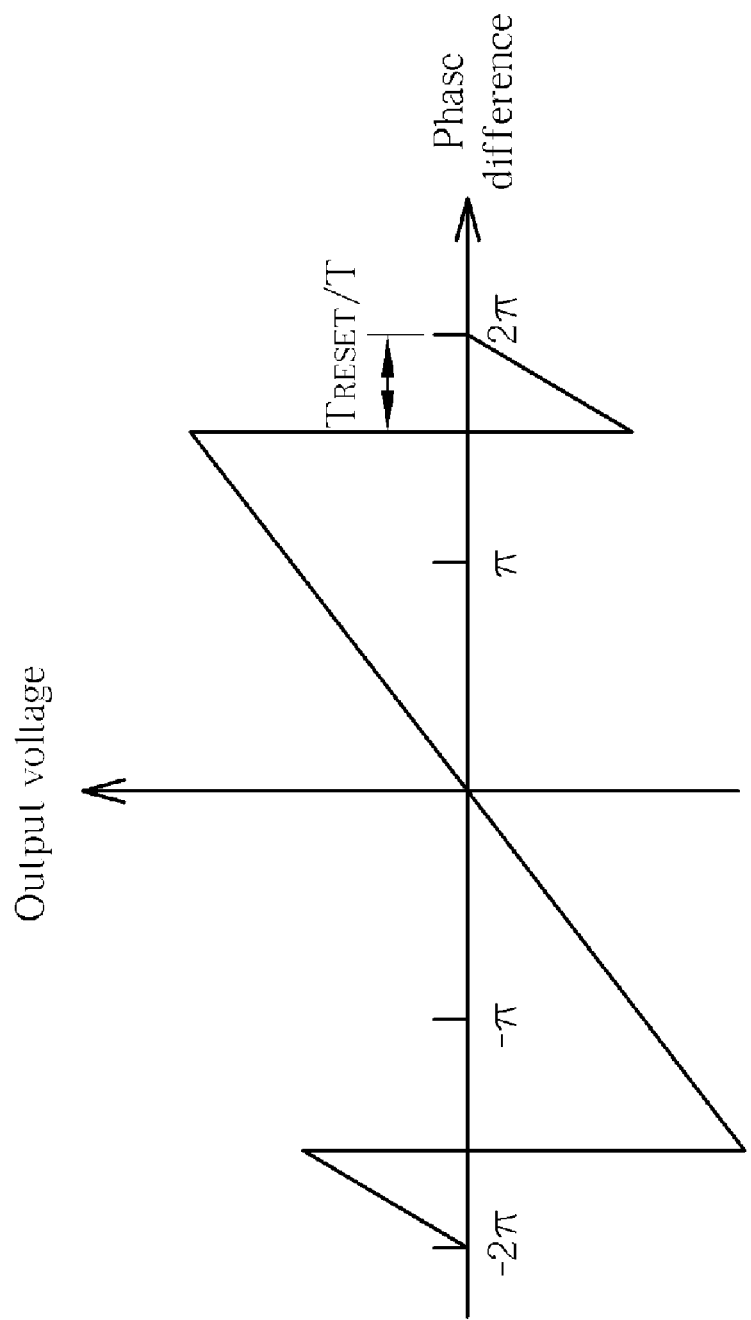
FIG. 3 is a diagram illustrating the relationship between the phase difference and the output voltage of the PLL utilizing the conventional PFD.
Figure 4:
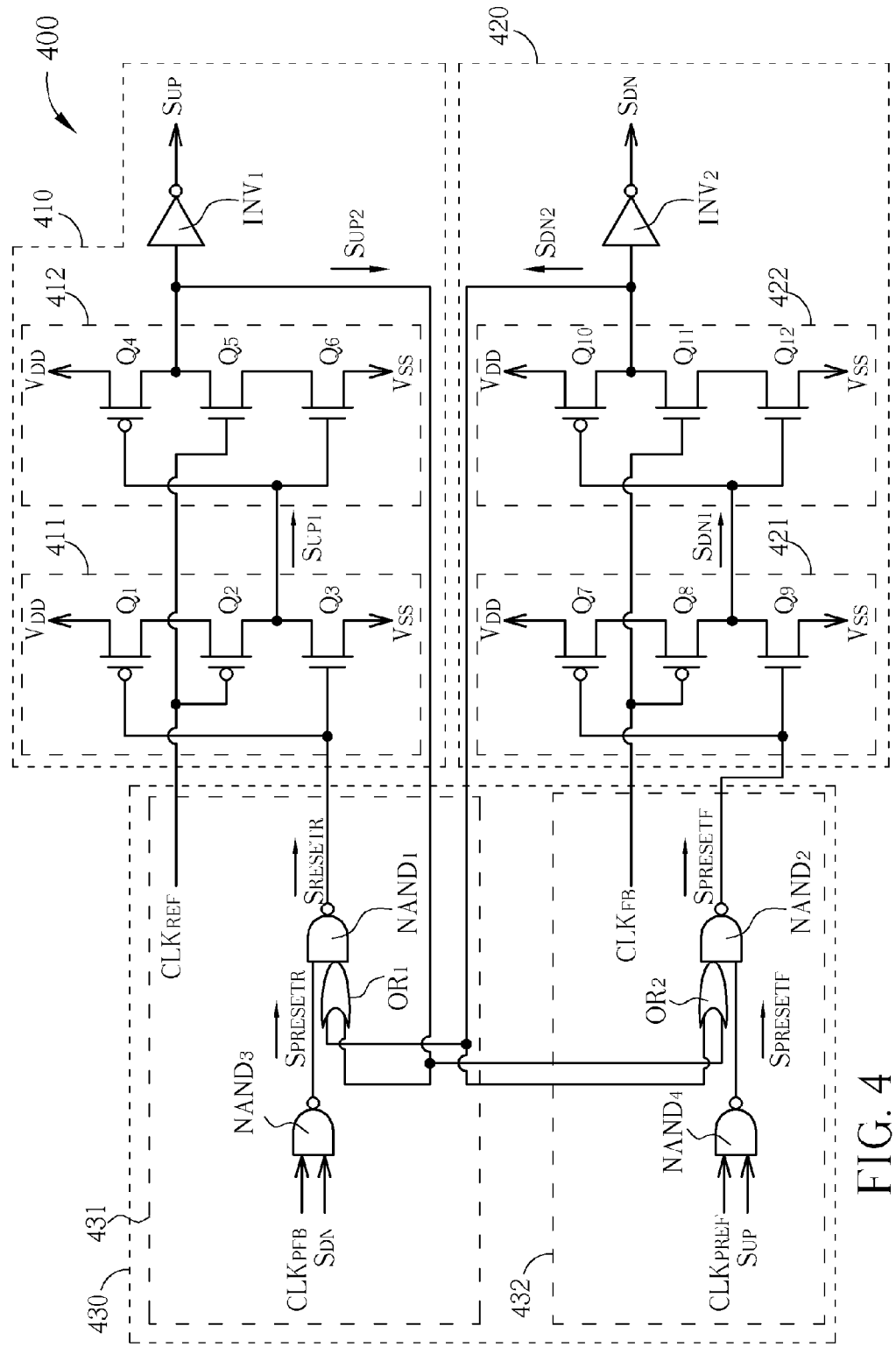
FIG. 4 is a diagram illustrating the PFD of the present invention.
Figure 5:
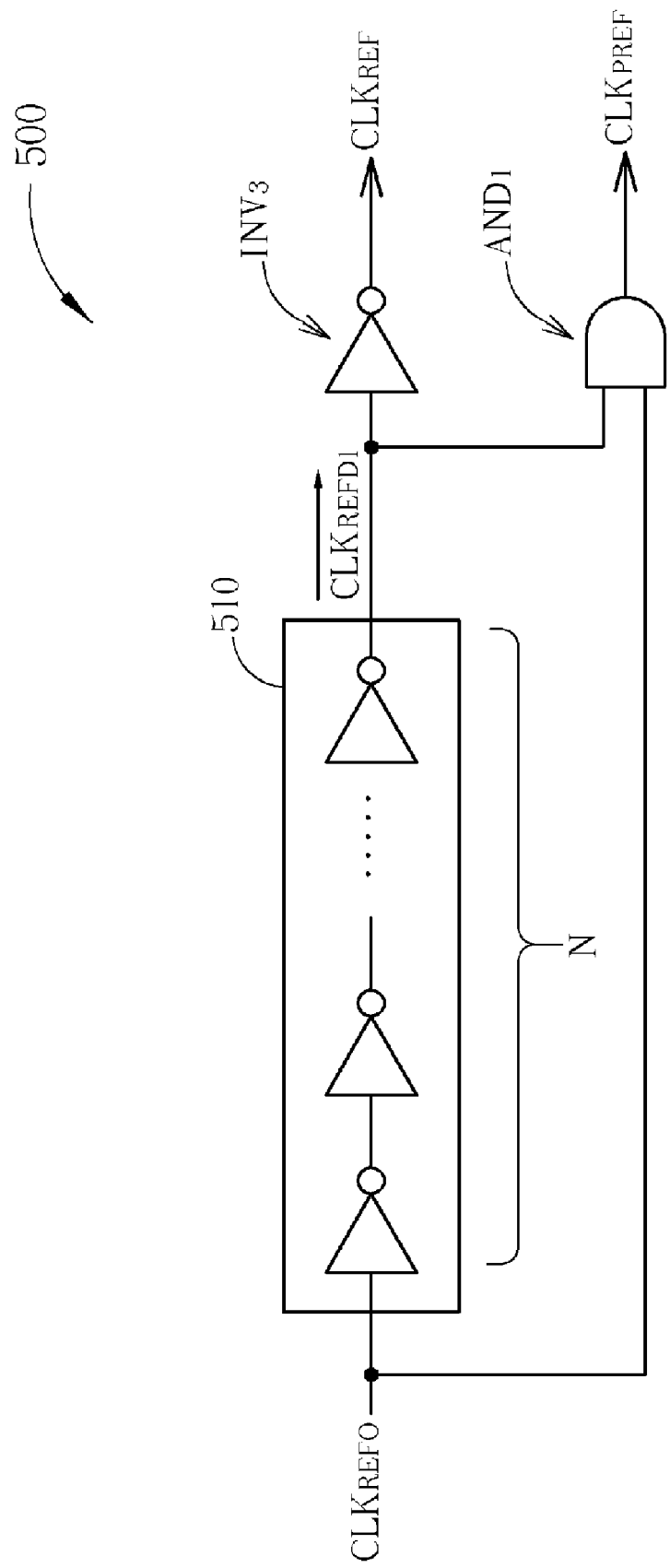
FIG. 5 is a diagram illustrating the reference clock signal control module of the present invention.
Figure 6:
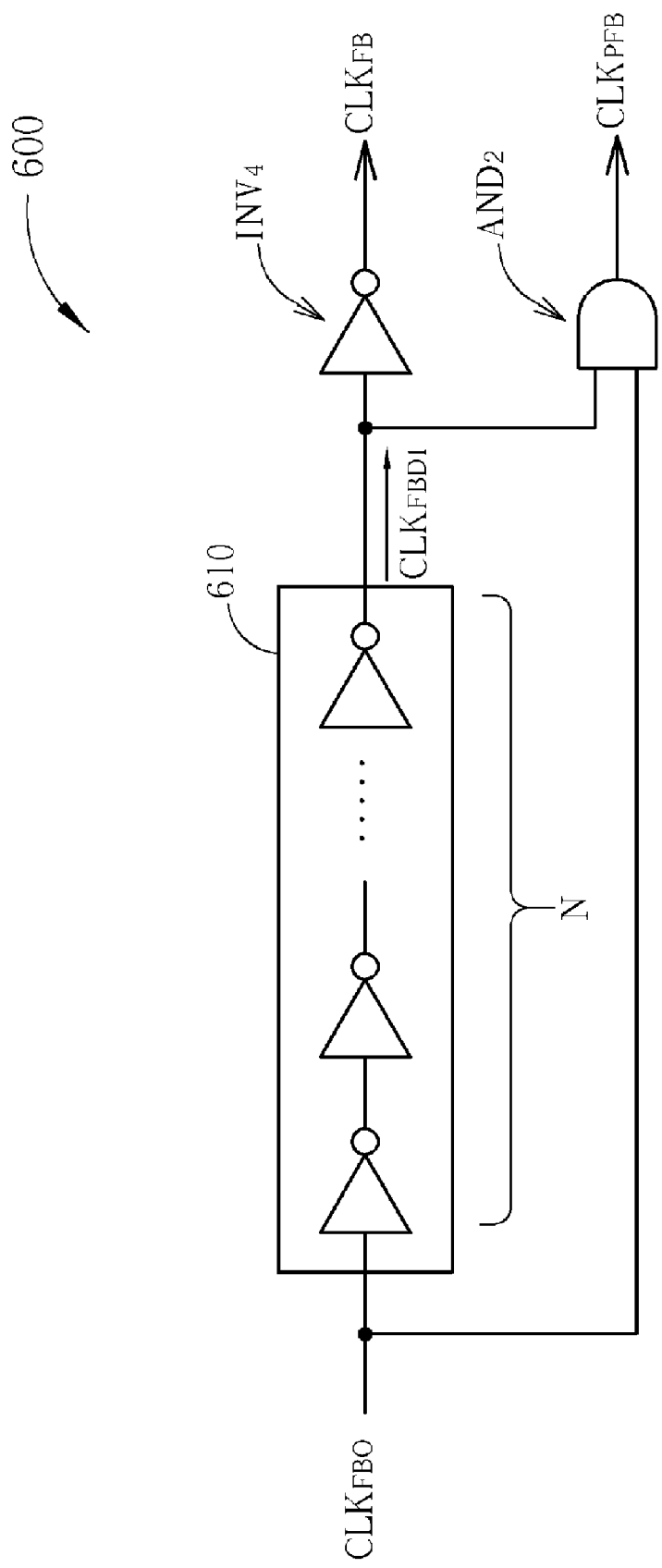
FIG. 6 is a diagram illustrating the fed-back clock signal control module.

Please refer to FIG. 4, FIG. 5, and FIG. 6 together. FIG. 4 is a diagram illustrating the PFD 400 of the present invention. FIG. 5 is a diagram illustrating the reference clock signal control module 500 of the present invention. FIG. 6 is a diagram illustrating the fed-back clock signal control module 600. The PFD 400 comprises a rising signal module, a falling signal module 420, and a reset signal module 430.

The rising signal module 410 can be realized with a flip-flop. The rising signal module 410 is disposed for receiving the reference clock signal $CLK_{REF}$ and accordingly outputting the rising signal $S_{UP}$, and for resetting the rising signal $S_{UP}$ according to the rising reset signal $S_{RESETR}$. The rising signal module 410 comprises a first-level rising signal circuit 411, a second-level rising signal circuit 412, and an inverter $INV_1$.

The first-level rising signal circuit 411 comprises three transistors $Q_1$, $Q_2$, and $Q_3$. The first end of the transistor $Q_1$ is coupled to a voltage source $V_{DD}$; the second end of the transistor $Q_1$ is coupled to the first end of the transistor $Q_2$; the control end of the transistor $Q_1$ receives the rising reset signal $S_{RESETR}$. The first end of the transistor $Q_2$ is coupled to the second end of the transistor $Q_1$; the second end of the transistor $Q_2$ is coupled to the first end of the transistor $Q_3$; the control end of the transistor $Q_2$ receives the reference clock signal $CLK_{REF}$. The second end of the transistor $Q_3$ is coupled to a voltage source $V_{SS}$ (ground); the first end of the transistor $Q_3$ is coupled to the second end of the transistor $Q_2$; the control end of the transistor $Q_3$ receives the rising reset signal $S_{RESETR}$. The first-level rising signal circuit 411 outputs the first-level rising signal $S_{UP1}$ at the second end of the transistor $Q_2$ according to the reference clock signal $CLK_{REF}$ and the rising reset signal $S_{RESETR}$.

The second-level rising signal circuit 412 comprises three transistors $Q_4$, $Q_5$, and $Q_6$. The first end of the transistor $Q_4$ is coupled to the voltage source $V_{DD}$; the second end of the transistor $Q_4$ is coupled to the first end of the transistor $Q_5$; the control end of the transistor $Q_4$ is coupled to the second end of the transistor $Q_2$ for receiving the first-level rising signal $S_{UP1}$. The first end of the transistor $Q_5$ is coupled to the second end of the transistor $Q_4$; the second end of the transistor $Q_5$ is coupled to the first end of the transistor $Q_6$; the control end of the transistor $Q_5$ receives the reference clock signal $CLK_{REF}$. The second end of the transistor $Q_6$ is coupled to the voltage source $V_{SS}$ (ground); the first end of the transistor $Q_6$ is coupled to the second end of the transistor $Q_5$; the control end of the transistor $Q_6$ is coupled to the second end of the transistor $Q_2$ for receiving the first-level rising signal $S_{UP1}$. The second-level rising signal circuit 412 outputs the second-level rising signal $S_{UP2}$ at the second end of the transistor $Q_4$ according to the reference clock signal $CLK_{REF}$ and the first-level rising signal $S_{UP1}$.

The input end of the inverter $INV_1$ is coupled to the second end of the transistor $Q_4$ for receiving the second-level rising signal $S_{UP2}$ and accordingly outputting the inverted second-level rising signal as the rising signal $S_{UP}$.

The falling signal module 420 can be realized with a flip-flop. The falling signal module 420 is disposed for receiving the fed-back clock signal $CLK_{FB}$ and accordingly outputting the falling signal $S_{DN}$, and for resetting the falling signal $S_{DN}$ according to the falling reset signal $S_{RESETF}$. The falling signal module 420 comprises a first-level falling signal circuit 421, a second-level falling signal circuit 422, and an inverter $INV_2$.

The first-level falling signal circuit 421 comprises three transistors $Q_7$, $Q_8$, and $Q_9$. The first end of the transistor $Q_7$ is coupled to the voltage source $V_{DD}$; the second end of the transistor $Q_7$ is coupled to the first end of the transistor $Q_8$; the control end of the transistor $Q_7$ receives the falling reset signal $S_{RESETF}$. The first end of the transistor $Q_8$ is coupled to the second end of the transistor $Q_7$; the second end of the transistor $Q_8$ is coupled to the first end of the transistor $Q_9$; the control end of the transistor $Q_8$ receives the fed-back clock signal $CLK_{FB}$. The second end of the transistor $Q_9$ is coupled to the voltage source $V_{SS}$ (ground); the first end of the transistor $Q_9$ is coupled to the second end of the transistor $Q_8$; the control end of the transistor $Q_9$ receives the falling reset signal $S_{RESETF}$. The first-level falling signal circuit 421 outputs the first-level falling signal $S_{DN1}$ at the second end of the transistor $Q_8$ according to the fed-back clock signal $CLK_{FB}$ and the falling reset signal $S_{RESETF}$.

The second-level falling signal circuit 422 comprises three transistors $Q_{10}$, $Q_{11}$, and $Q_{12}$. The first end of the transistor $Q_{10}$ is coupled to the voltage source $V_{DD}$; the second end of the transistor $Q_{10}$ is coupled to the first end of the transistor $Q_{11}$; the control end of the transistor $Q_{10}$ is coupled to the second end of the transistor $Q_8$ for receiving the first-level falling signal $S_{DN1}$. The first end of the transistor $Q_{11}$ is coupled to the second end of the transistor $Q_{10}$; the second end of the transistor $Q_{11}$ is coupled to the first end of the transistor $Q_{12}$; the control end of the transistor $Q_{11}$ receives the fed-back clock signal $CLK_{FB}$. The second end of the transistor $Q_{12}$ is coupled to the voltage source $V_{SS}$ (ground); the first end of the transistor $Q_{12}$ is coupled to the second end of the transistor $Q_{11}$; the control end of the transistor $Q_{12}$ is coupled to the second end of the transistor $Q_8$ for receiving the first-level falling signal $S_{DN1}$. The second-level falling signal circuit 422 outputs the second-level falling signal $S_{DN2}$ at the second end of the transistor $Q_{10}$ according to the fed-back clock signal $CLK_{FB}$ and the first-level falling signal $S_{DN1}$.

The input end of the inverter $INV_2$ is coupled to the second end of the transistor $Q_{10}$ for receiving the second-level falling signal $S_{DN2}$ and accordingly outputting the inverted second-level falling signal as the falling signal $S_{DN}$.

Additionally, the transistors $Q_1$, $Q_2$, $Q_4$, $Q_7$, $Q_8$, and $Q_{10}$ are P channel Metal Oxide Semiconductor (PMOS) transistors; the transistors $Q_3$, $Q_5$, $Q_6$, $Q_9$, $Q_{11}$, and $Q_{12}$ are NMOS transistors.

The reset signal module 430 comprises a rising reset signal module 431, and a falling reset signal module 432.

The rising reset signal module 431 comprises a fed-back clock signal control module 600 (as shown in FIG. 6), two NAND gates $NAND_1$ and $NAND_2$, and an OR gate $OR_1$.

The fed-back clock signal control module 600 comprises an inverting delay module 610, an inverter $INV_4$, and an AND gate $AND_2$.

The inverting delay module 610 is disposed for delaying an original fed-back clock signal $CLK_{FBO}$ by a predetermined period $T_P$ and inverting the delayed fed-back clock signal in order to generate the clock signal $CLK_{FBDI}$. The inverting delay module 610 can be realized with N inverters coupled in series, and the number N is an odd number. Each of the inverters has the same delay period, and therefore the sum of the delay period of the N inverters equals to the predetermined period $T_P$. The predetermined period $T_P$ equals to the minimum of the reset signal $S_{RESET}$ required by the conventional PFD 100, and equals to the reaction period required by the signal being reset from the rising signal module 410 in the present invention.

The inverter $INV_4$ is coupled to the output end of the inverting delay module 610 for inverting the clock signal $CLK_{FBDI}$ and accordingly generating the fed-back clock signal $CLK_{FB}$.

The first input end of the AND gate $AND_2$ is coupled to the output end of the inverting delay module 610 for receiving the clock signal $CLK_{FBDI}$; the second end of the AND gate $AND_2$ receives the original fed-back clock signal $CLK_{FBO}$; the output end of the AND gate $AND_2$ outputs the pre-trigger fed-back signal $CLK_{PFB}$. The AND gate $AND_2$ operates AND calculation on the clock signals $CLK_{FBDI}$ and $CLK_{FBO}$ and outputs the result as the pre-trigger fed-back signal $CLK_{PFB}$.

The first input end of the NAND gate $NAND_3$ is coupled to the output end of the AND gate $AND_2$ for receiving the pre-trigger fed-back signal $CLK_{PFB}$; the second input end of the NAND gate $NAND_3$ is coupled to the output end of the inverter $INV_1$ for receiving the rising signal $S_{UP}$; the output end of the NAND gate $NAND_3$ outputs the pre-trigger rising reset signal $S_{PRESETR}$. The NAND gate $NAND_3$ operates NAND calculation on the pre-trigger fed-back signal $CLK_{PFB}$ and the rising signal $S_{UP}$ and outputs the result as the pre-trigger rising reset signal $S_{PRESETR}$.

The first input end of the OR gate $OR_1$ is coupled to the output end of the second-level rising circuit 412 (the second end of the transistor $Q_4$) for receiving the second-level rising signal $S_{UP2}$; the second input end of the OR gate $OR_1$ is coupled to the output end of the second-level falling circuit 422 (the second end of the transistor $Q_{10}$) for receiving the second-level falling signal $S_{DN2}$; the output end of the OR gate $OR_1$ is coupled to the second input end of the NAND gate $NAND_1$. The OR gate $OR_1$ operates OR calculation on the second-level rising signal $S_{UP2}$ and the second-level falling signal $S_{DN2}$ and outputs the result to the second end of the NAND gate $NAND_1$.

The first input end of the NAND gate $NAND_1$ is coupled to the output end of the NAND gate $NAND_3$ for receiving the pre-trigger rising reset signal $S_{PRESETR}$; the second input end of the NAND gate $NAND_1$ is coupled to the output end of the OR gate $OR_1$; the output end of the NAND gate $NAND_3$ outputs the rising reset signal $S_{RESETR}$. The NAND gate $NAND_3$ operates NAND calculation on the signals received on the first and the second input ends of the NAND gate $NAND_3$ and outputs the result as the rising reset signal $S_{RESETR}$.

The falling reset signal module 432 comprises a reference clock signal control module 500 (as shown in FIG. 5), two NAND gates $NAND_2$ and $NAND_4$, and an OR gate $OR_2$.

The reference clock signal control module 500 comprises an inverting delay module 510, an inverter $INV_3$, and an AND gate $AND_1$.

The inverting delay module 510 is disposed for delaying an original reference clock signal $CLK_{REFO}$ by a predetermined period $T_P$ and inverting the delayed reference clock signal in order to generate the clock signal $CLK_{REFDI}$. The inverting delay module 510 can be realized with N inverters coupled in series, and the number N is an odd number. Each of the inverters has the same delay period, and therefore the sum of the delay period of the N inverters equals to the predetermined period $T_P$, which is same as the inverting delay module 610.

The inverter $INV_3$ is coupled to the output end of the inverting delay module 510 for inverting the clock signal $CLK_{REFDI}$ and accordingly generating the reference clock signal $CLK_{REF}$.

The first input end of the AND gate $AND_1$ is coupled to the output end of the inverting delay module 510 for receiving the clock signal $CLK_{REFDI}$; the second end of the AND gate $AND_1$ receives the original reference clock signal $CLK_{REFO}$; the output end of the AND gate $AND_1$ outputs the pre-trigger reference signal $CLK_{PREF}$. The AND gate $AND_1$ AND calculation on the clock signals $CLK_{REFDI}$ and $CLK_{REFO}$ and outputs the result as the pre-trigger reference signal $CLK_{PREF}$.

The first input end of the NAND gate $NAND_4$ is coupled to the output end of the AND gate $AND_1$ for receiving the pre-trigger reference signal $CLK_{PREF}$; the second input end of the NAND gate $NAND_4$ is coupled to the output end of the inverter $INV_2$ for receiving the falling signal $S_{DN}$; the output end of the NAND gate $NAND_4$ outputs the pre-trigger falling reset signal $S_{PRESETF}$. The NAND gate $NAND_4$ operates NAND calculation on the pre-trigger reference signal $CLK_{PREF}$ and the falling signal $S_{DN}$ and outputs the result as the pre-trigger falling reset signal $S_{PRESETF}$.

The first input end of the OR gate $OR_2$ is coupled to the output end of the second-level falling circuit 422 (the second end of the transistor $Q_{10}$) for receiving the second-level falling signal $S_{DN2}$; the second input end of the OR gate $OR_2$ is coupled to the output end of the second-level rising circuit 412 (the second end of the transistor $Q_4$) for receiving the second-level rising signal $S_{UP2}$; the output end of the OR gate $OR_2$ is coupled to the second input end of the NAND gate $NAND_2$. The OR gate $OR_2$ operates OR calculation on the second-level rising signal $S_{UP2}$ and the second-level falling signal $S_{DN2}$ and outputs the result to the second end of the NAND gate $NAND_2$.

The first input end of the NAND gate $NAND_2$ is coupled to the output end of the NAND gate $NAND_4$ for receiving the pre-trigger falling reset signal $S_{PRESETF}$; the second input end of the NAND gate $NAND_2$ is coupled to the output end of the OR gate $OR_2$; the output end of the NAND gate $NAND_2$ outputs the falling reset signal $S_{RESETF}$. The NAND gate $NAND_2$ operates NAND calculation on the signals received on the first and the second input ends of the NAND gate $NAND_2$ and outputs the result as the falling reset signal $S_{RESETF}$.

Figure 7:
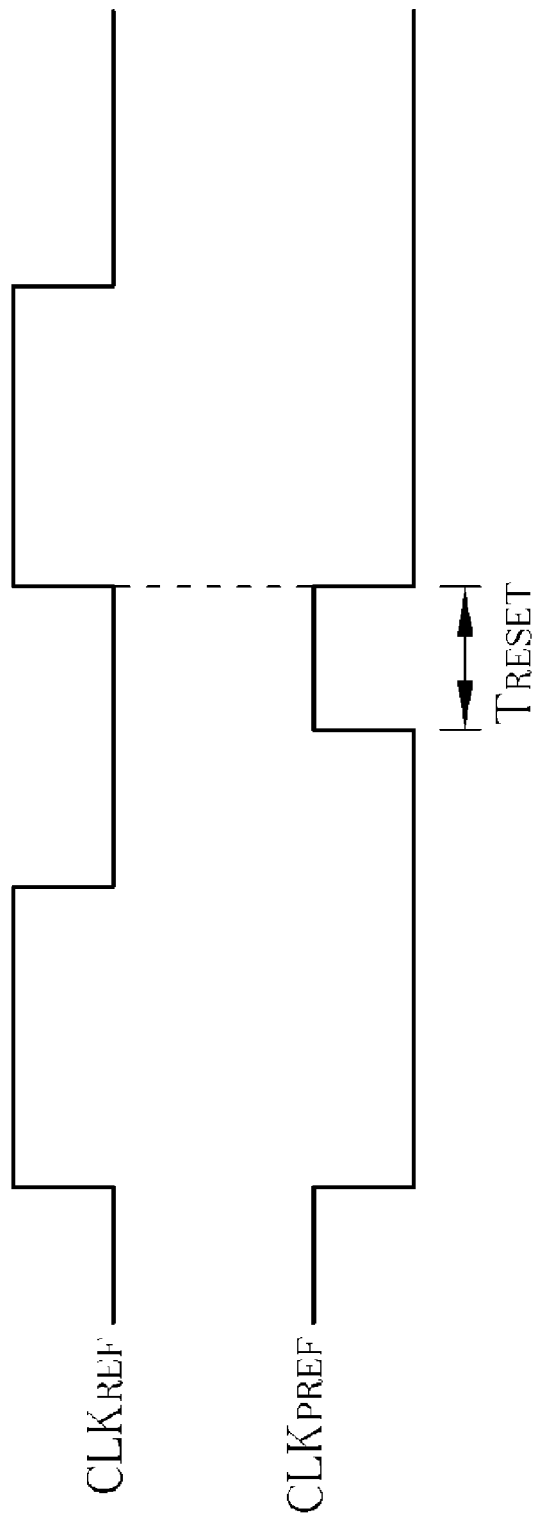
FIG. 7 is a diagram illustrating the relationship between the pre-trigger reference signal and the reference clock signal.
Figure 8:
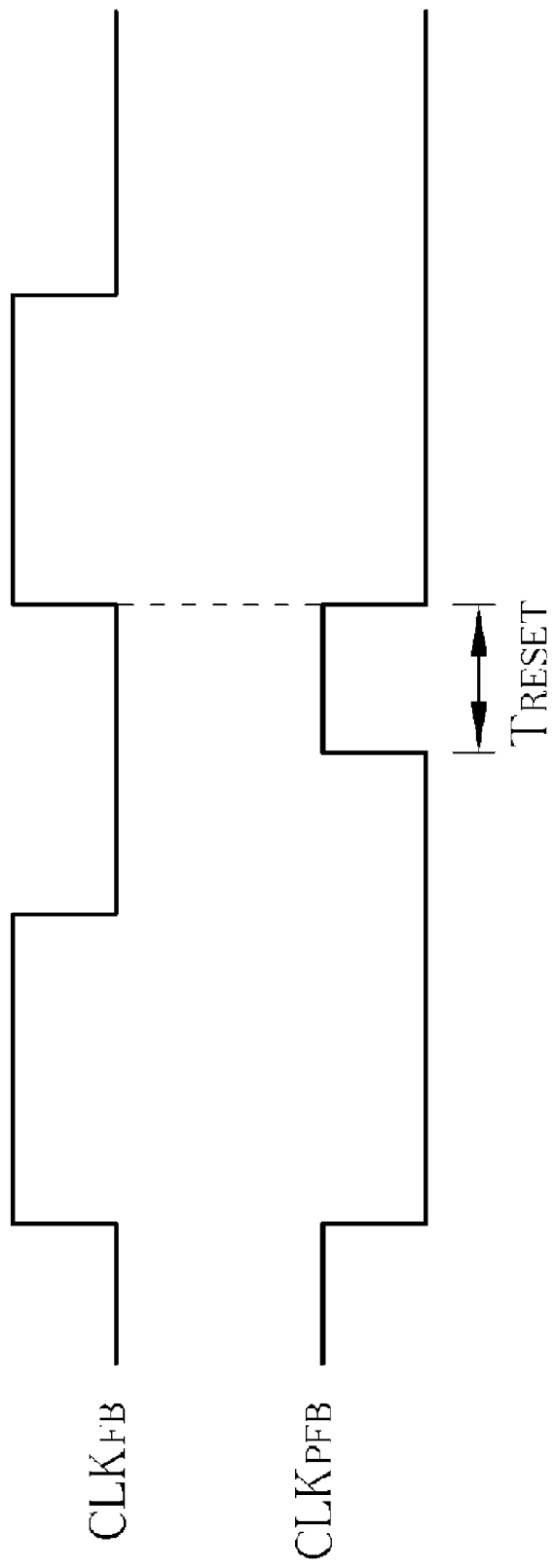
FIG. 8 is a diagram illustrating the relationship between the pre-trigger fed-back signal and the fed-back clock signal.

Please refer to FIG. 7 and FIG. 8 together. FIG. 7 is a diagram illustrating the relationship between the pre-trigger reference signal and the reference clock signal. FIG. 8 is a diagram illustrating the relationship between the pre-trigger fed-back signal and the fed-back clock signal. As shown in FIG. 7, the pre-trigger reference signal $CLK_{PREF}$ rises up to logic "1" by the period $T_{RESET}$ (equals to $T_P$) before each rising edge of the reference clock signal $CLK_{REF}$. As shown in FIG. 8, the pre-trigger fed-back signal $CLK_{PFB}$ rises up to logic "1" by the period $T_{RESET}$ (equals to $T_P$) before each rising edge of the fed-back clock signal $CLK_{FB}$.

Figure 9:
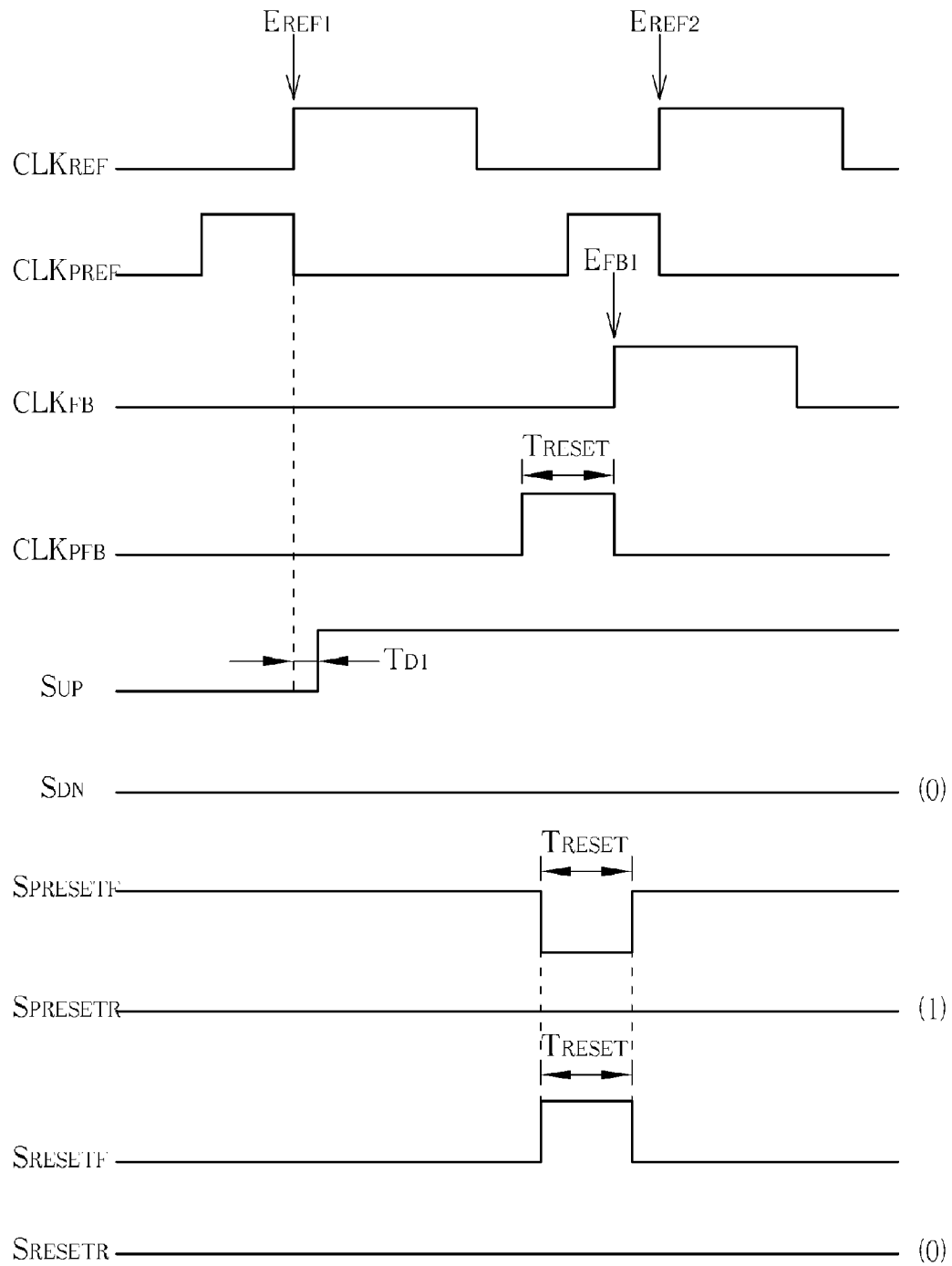
FIG. 9 is a diagram illustrating the operation of the PFD of the present invention when the phases of the reference clock signal and the fed-back clock signal are very close.

Please refer to FIG. 9. FIG. 9 is a diagram illustrating the operation of the PFD of the present invention when the phases of the reference clock signal and the fed-back clock signal are very close. As shown in FIG. 9, the fed-back clock signal $CLK_{FB}$ falls behind the reference clock signal $CLK_{REF}$, and the first rising edge $E_{FB1}$ of the fed-back clock signal $CLK_{FB}$ is very close to the second rising edge $E_{REF2}$ of the reference clock signal $CLK_{REF}$. In such condition, the conventional PFD decreases the frequency of the fed-back clock signal $CLK_{FB}$ in order to lock the phase equal to the phase of the reference clock signal $CLK_{REF}$, which is incorrect. In fact, in such condition, the frequency of the fed-back clock signal $CLK_{FB}$ should be increased to be in-phase with the reference clock signal $CLK_{REF}$. In FIG. 9, when the first rising edge $E_{REF1}$ of the reference clock signal $CLK_{REF}$ occurs, after the reaction time $T_{D1}$, the rising signal $S_{UP}$ is triggered to be logic "1". When the second rising edge $E_{REF2}$ of the reference clock signal $CLK_{REF}$ occurs, the corresponding pre-trigger reference signal $CLK_{PREF}$ and the rising signal $S_{UP}$ being logic "1" at the time are inputted to the falling reset signal module 432. After the logic calculation of the falling reset signal module 432, the falling reset signal $S_{RESETF}$ is outputted by logic "1" (logic "1" represents reset) and remains for the period $T_{RESET}$. When the first rising edge $E_{FB1}$ of the fed-back clock signal $CLK_{FB}$ occurs, since it falls within the range of the resetting duration of the falling reset signal $S_{RESETF}$, the falling signal module 420, at the time, is being reset. Therefore, the falling signal $S_{DN}$ keeps at logic "0" and consequently the fed-back clock signal $CLK_{FB}$ is not decreased. In this way, the phase determining problem generated from the conventional PFD can be avoided.

Figure 10:
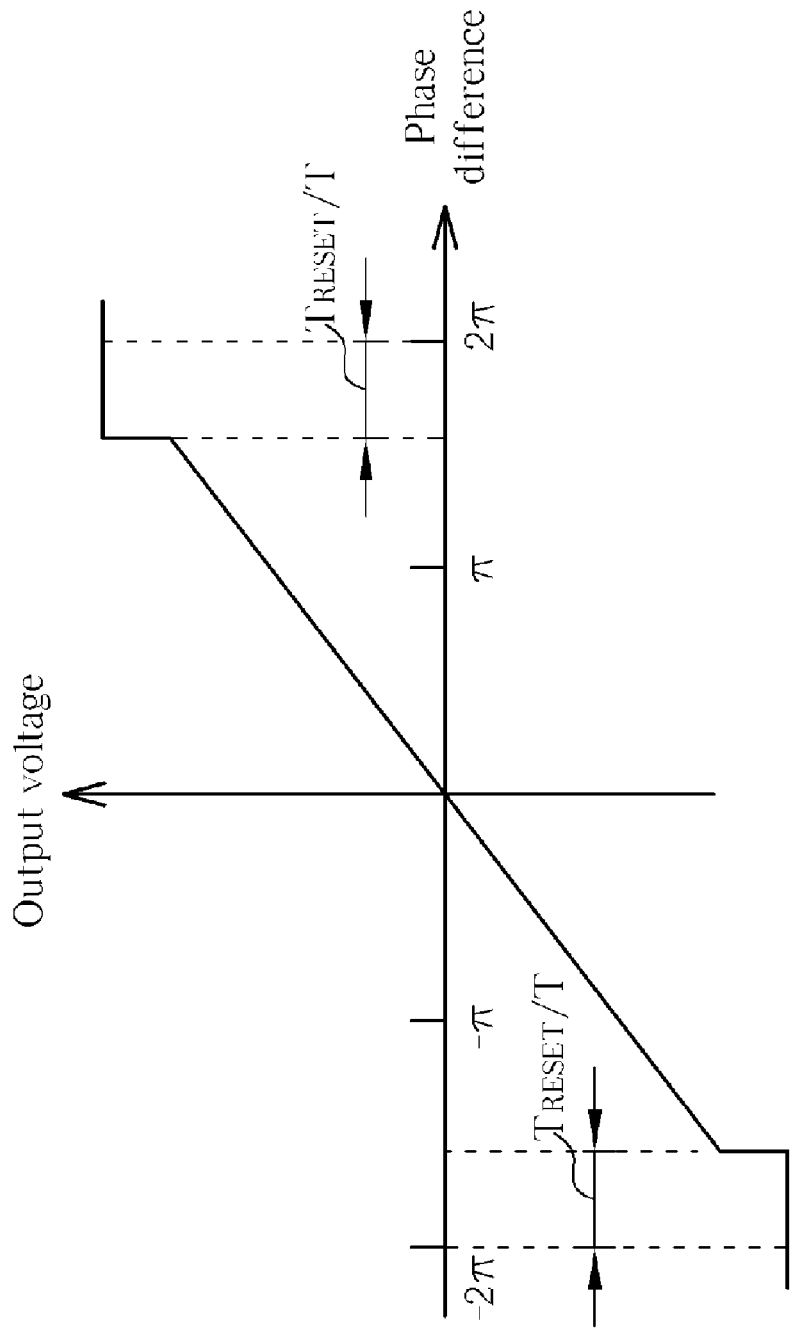
FIG. 10 is a diagram illustrating the relationship between the output voltage of the PLL utilizing the PFD of the present invention and the phase difference.

Please refer to FIG. 10. FIG. 10 is a diagram illustrating the relationship between the output voltage of the PLL utilizing the PFD 400 of the present invention and the phase difference. It is assumed that the period of the reference clock signal $CLK_{REF}$ is T. As shown in FIG. 10, when the phase of the reference clock signal $CLK_{REF}$ is ahead of the fed-back clock signal $CLK_{FB}$ by the range from 0 to $(T_{RESET}/T)$, the output voltage of the voltage controller of the PLL keeps rising and positive. That is, the frequency of the fed-back clock signal $CLK_{FB}$ would be increased. When the phase of the reference clock signal $CLK_{REF}$ is ahead of the fed-back clock signal $CLK_{FB}$ by the range from $(T_{RESET}/T)$ to $2\pi$, the output voltage of the voltage controller of the PLL keeps constant and still positive. That is, the frequency of the fed-back clock signal $CLK_{FB}$ would be still increased so that the phase of the fed-back clock signal $CLK_{FB}$ is not locked to the incorrect direction. When the phase of the reference clock signal $CLK_{REF}$ falls behind the fed-back clock signal $CLK_{FB}$ by the range from 0 to $(-T_{RESET}/T)$, the output voltage of the voltage controller of the PLL keeps falling and negative. That is, the frequency of the fed-back clock signal $CLK_{FB}$ would be decreased. When the phase of the reference clock signal $CLK_{REF}$ falls behind the fed-back clock signal $CLK_{FB}$ by the range from $(-T_{RESET}/T)$ to $-2\pi$, the output voltage of the voltage controller of the PLL keeps constant and still negative. That is, the frequency of the fed-back clock signal $CLK_{FB}$ would be decreased so that the phase of the fed-back clock signal $CLK_{FB}$ is not locked to the incorrect direction.

To sum up, the PFD provided by the present invention, comprises reset signal module utilizing pre-trigger reference signal and the pre-trigger fed-back signal, for resetting the rising signal module and the falling signal module, respectively. In this way, the incorrect phase determination due to the reaction time of the reset signal can be avoided, providing great convenience.

Those skilled in the art will readily observe that numerous modifications and alterations of the device and method may be made while retaining the teachings of the invention.

What is claimed is:

1. A Phase/Frequency Detector (PFD), comprising:
a rising signal module for generating a rising signal according to a second reference clock signal and a rising reset signal;
a falling signal module for generating a falling signal according to a second fed-back clock signal and a falling reset signal; and
a reset signal module, comprising:
a rising reset signal module, comprising:
a first NAND gate, comprising:
a first input end for receiving a pre-trigger fed-back signal;
a second input end for receiving the falling signal; and
an output end for outputting result of NAND operation on signals received on the first and the second input ends of the first NAND gate;
a first OR gate, comprising:
a first input end for receiving an inverted signal of the rising signal;
a second input end for receiving an inverted signal of the falling signal; and
an output end for outputting result of OR operation on signals received on the first and the second input ends of the first OR gate;
a second NAND gate, comprising:
a first input end coupled to the output end of the first NAND gate;
a second input end coupled to the output end of the first OR gate; and
an output end for outputting result of NAND operation on signals received on the first and the second input ends of the second NAND gate as the rising reset signal; and
a falling reset signal module, comprising:
a third NAND gate, comprising:
a first input end for receiving a pre-trigger reference signal;
a second input end for receiving the rising signal; and
an output end for outputting result of NAND operation on signals received on the first and the second input ends of the third NAND gate;
a second OR gate, comprising:
a first input end for receiving an inverted signal of the rising signal;
a second input end for receiving an inverted signal of the falling signal; and an output end for outputting result of OR operation on signals received on the first and the second input ends of the second OR gate;

a fourth NAND gate, comprising:
a first input end coupled to the output end of the third NAND gate;
a second input end coupled to the output end of the second OR gate; and
an output end for outputting result of NAND operation on signals received on the first and the second input ends of the fourth NAND gate as the falling reset signal.

2. The PFD of claim 1, further comprising:
a reference clock signal control module, comprising:
a first inverting delay module for delaying a first reference clock signal by a first predetermined period and inverting the delayed first reference clock signal as a third reference clock signal;
a first inverter coupled to an output end of the first inverting delay module for inverting the third reference clock signal as the second reference clock signal; and
a first AND gate, comprising:
a first input end coupled to an input end of the first inverting delay module for receiving the first reference clock signal;
a second end coupled to the output end of the first inverting delay module for receiving the third reference clock signal; and
an output end for outputting result of AND operation on signals received on the first and the second input ends of the first AND gate as the pre-trigger reference signal.

3. The PFD of claim 2, wherein the first inverting delay module comprises M fifth inverters, an input end of the first one of the fifth inverters receives the first reference clock signal, an input end of the $K^{th}$ one of the fifth inverters coupled to an output end of the $(K-1)^{th}$ one of the fifth inverters, and an output end of the $M^{th}$ one of the fifth inverters outputs the third reference clock signal; each of the fifth inverters delays for a second predetermined period; the first predetermined period is M times the second predetermined period; wherein M is an odd number, K is a positive integer, and $1 \leq K \leq M$.

4. The PFD of claim 2, further comprising:
a fed-back clock signal control module, comprising:
a second inverting delay module for delaying a first fed-back clock signal by the first predetermined period and inverting the delayed first fed-back clock signal as a third fed-back clock signal;
a second inverter coupled to an output end of the second inverting delay module for inverting the third fed-back clock signal as the second fed-back clock signal; and
a second AND gate, comprising:
a first input end coupled to an input end of the second inverting delay module for receiving the first fed-back clock signal;
a second end coupled to the output end of the second inverting delay module for receiving the third fed-back clock signal; and
an output end for outputting result of AND operation on signals received on the first and the second input ends of the second AND gate as the pre-trigger fed-back signal.

5. The PFD of claim 4, wherein the second inverting delay module comprises M sixth inverters, an input end of the first one of the sixth inverters receives the first fed-back clock signal, an input end of the $K^{th}$ one of the sixth inverters coupled to an output end of the $(K-1)^{th}$ one of the sixth inverters, and an output end of the $M^{th}$ one of the sixth inverters outputs the third fed-back clock signal; each of the sixth inverters delays for a second predetermined period; the first predetermined period is M times the second predetermined period; wherein M is an odd number, K is a positive integer, and $1 \leq K \leq M$.

6. The PFD of claim 1, wherein the rising signal module comprises:
a first-level rising signal circuit for generating a first-level rising signal according to the second reference clock signal and the rising reset signal;
a second-level rising signal circuit for generating an inverted signal of the rising signal according to the second reference clock signal and the first-level rising signal; and
a third inverter coupled to the second-level rising circuit for receiving the inverted signal of the rising signal and accordingly generating the rising signal.

7. The PFD of claim 6, wherein the first-level rising signal circuit comprises:
a first transistor, comprising:
a first end coupled to a voltage source;
a second end; and
a control end coupled to the output end of the second NAND gate for receiving the rising reset signal;
a second transistor, comprising:
a first end coupled to the second end of the first transistor;
a second end for outputting the first-level rising signal; and
a control end coupled to the first inverter for receiving the second reference clock signal; and
a third transistor, comprising:
a first end coupled to the second end of the second transistor;
a second end coupled to a ground end; and
a control end coupled to the output end of the second NAND gate for receiving the rising reset signal.

8. The PFD of claim 7, wherein the second-level rising signal circuit comprises:
a fourth transistor, comprising:
a first end coupled to the voltage source;
a second end; and
a control end coupled to the second end of the second transistor for receiving the first-level rising signal;
a fifth transistor, comprising:
a first end coupled to the second end of the fourth transistor and the third inverter for outputting the inverted signal of the rising signal;
a second end; and
a control end coupled to the first inverter for receiving the second reference clock signal; and
a sixth transistor, comprising:
a first end coupled to the second end of the fifth transistor;
a second end coupled to the ground end; and
a control end coupled to the second end of the second transistor for receiving the first-level rising signal.

9. The PFD of claim 8, wherein the first, the second, and the fourth transistors are P channel Metal Oxide Semiconductor (PMOS) transistors; the third, the fifth, and the sixth transistors are NMOS transistors.

10. The PFD of claim 6, wherein the falling signal module comprises:

a first-level falling signal circuit for generating a first-level falling signal according to the second fed-back clock signal and the falling reset signal;

a second-level falling signal circuit for generating an inverted signal of the falling signal according to the second fed-back clock signal and the first-level falling signal; and a fourth inverter coupled to the second-level falling circuit for receiving the inverted signal of the falling signal and accordingly generating the falling signal.

11. The PFD of claim 10, wherein the first-level falling signal circuit comprises:

a seventh transistor, comprising:
    a first end coupled to the voltage source;
    a second end; and
    a control end coupled to the output end of the fourth NAND gate for receiving the falling reset signal;

an eighth transistor, comprising:
    a first end coupled to the second end of the seventh transistor;
    a second end for outputting the first-level falling signal; and
    a control end coupled to the second inverter for receiving the second fed-back clock signal; and a ninth transistor, comprising:
    a first end coupled to the second end of the eighth transistor;
    a second end coupled to the ground end; and
    a control end coupled to the output end of the fourth NAND gate for receiving the falling reset signal.

12. The PFD of claim 11, wherein the second-level falling signal circuit comprises:

a tenth transistor, comprising:
    a first end coupled to the voltage source;
    a second end; and
    a control end coupled to the second end of the eighth transistor for receiving the first-level falling signal;

an eleventh transistor, comprising:
    a first end coupled to the second end of the tenth transistor and the fourth inverter for outputting the inverted signal of the falling signal;
    a second end; and
    a control end coupled to the second inverter for receiving the second fed-back clock signal; and a twelfth transistor, comprising:
    a first end coupled to the second end of the tenth transistor;
    a second end coupled to the ground end; and
    a control end coupled to the second end of the eighth transistor for receiving the first-level falling signal.

13. The PFD of claim 12, wherein the seventh, the eighth, and the tenth transistors are PMOS transistors; the ninth, the eleventh, and the twelfth transistors are NMOS transistors.

* * * * *